United States Patent
Yeh et al.

(10) Patent No.: US 6,854,179 B2
(45) Date of Patent: Feb. 15, 2005

(54) MODIFICATION OF CIRCUIT FEATURES THAT ARE INTERIOR TO A PACKAGED INTEGRATED CIRCUIT

(75) Inventors: Albert An-Bon Yeh, Colorado Springs, CO (US); Regina Nora Pabilonia, Colorado Springs, CO (US); Robert William Kressin, Colorado Springs, CO (US); Wei Liu, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 126 days.

(21) Appl. No.: 10/206,089

(22) Filed: Jul. 25, 2002

(65) Prior Publication Data

US 2004/0018652 A1 Jan. 29, 2004

(51) Int. Cl.⁷ .................................................. H05K 3/30
(52) U.S. Cl. ......................................... 29/833; 378/196
(58) Field of Search .......................... 378/196; 414/225; 29/833; 364/552

(56) References Cited

U.S. PATENT DOCUMENTS

| | | | |
|---|---|---|---|
| 4,915,565 A | * | 4/1990 | Bond et al. .................. 29/740 |
| 5,541,856 A | * | 7/1996 | Hammermeister .......... 378/196 |
| 6,165,658 A | | 12/2000 | Taff et al. |
| 6,219,908 B1 | * | 4/2001 | Farnworth et al. ............ 29/833 |
| 6,248,428 B1 | | 6/2001 | Asai et al. |
| 6,261,671 B1 | | 7/2001 | Asai et al. |
| 6,344,371 B2 | | 2/2002 | Fischer et al. |
| 6,376,049 B1 | | 4/2002 | Asai et al. |
| 6,376,052 B1 | | 4/2002 | Asai et al. |

\* cited by examiner

*Primary Examiner*—John F. Niebling
*Assistant Examiner*—Andre' C. Stevenson

(57) ABSTRACT

A circuit feature that is interior to a packaged integrated circuit is modified by first identifying a trimming point on the interior circuit feature using an x-ray inspection system. Coordinates of the trimming point are then related to the coordinates of a visible reference marker. The relationship between the visible reference marker and the trimming point is then used to position a cutting tool over the trimming point. Finally, the cutting tool is used to make one or more cuts into the packaged integrated circuit, until the interior circuit feature has been acceptably modified at the trimming point.

15 Claims, 11 Drawing Sheets

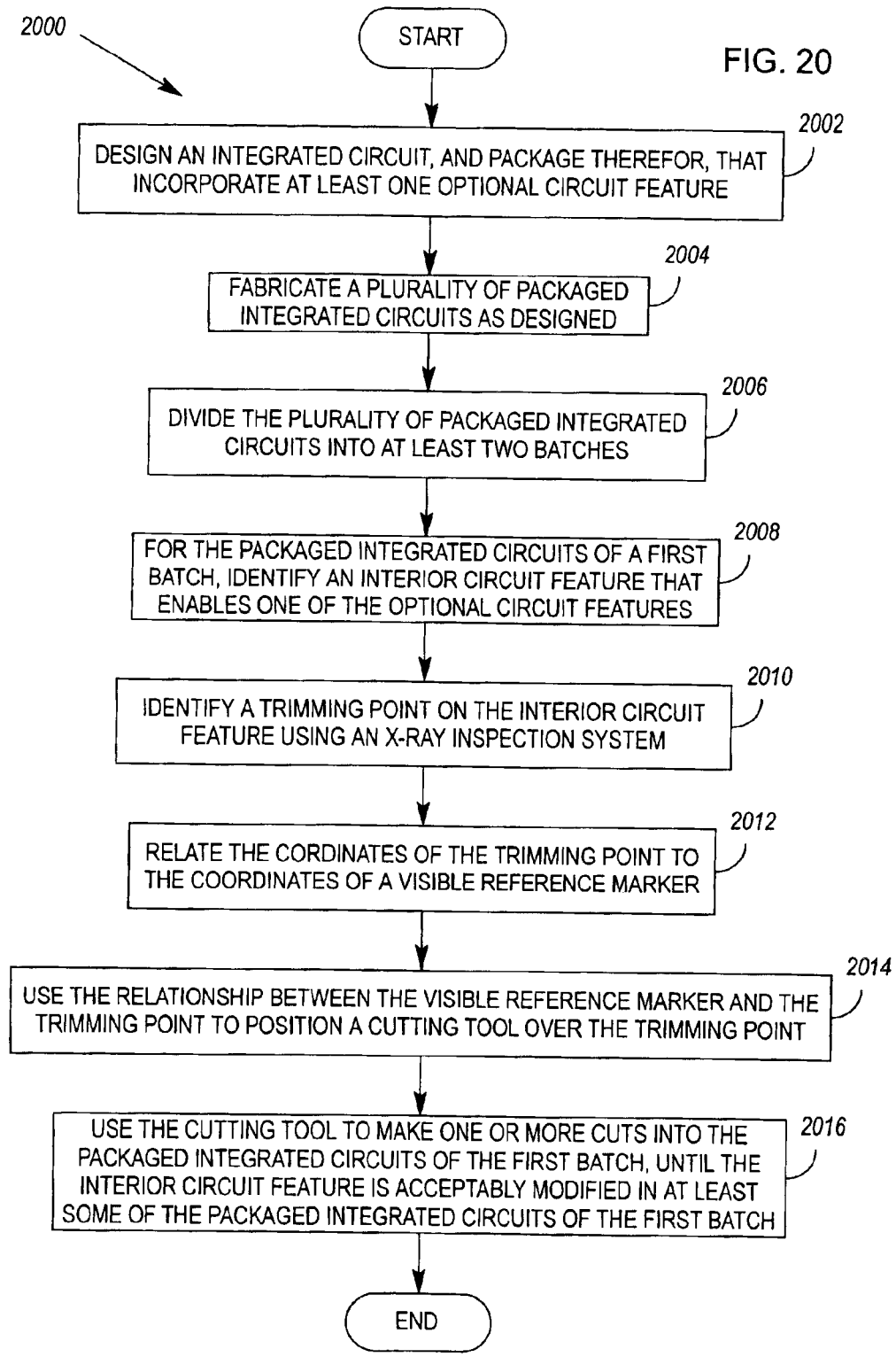

MODIFICATION OF CIRCUIT FEATURES THAT ARE INTERIOR TO A PACKAGED INTEGRATED CIRCUIT

FIELD OF THE INVENTION

The invention pertains to the modification of circuit features that are interior to a packaged integrated circuit.

BACKGROUND OF THE INVENTION

After completing an integrated circuit (IC) design, an engineer must test the functionality and robustness of his or her design. Unfortunately, there is no easy way to do this without fabricating and packaging a "lot" of ICs, in accordance with the design. As is known in the art, a "lot" of ICs may comprise dozens, hundreds, or even thousands of ICs.

If during test, a design flaw or manufacturing error is identified within one of the packaged ICs, then the entire lot of ICs is typically scrapped, as the permanent nature of an IC's packaging has made the repair of any defect interior to the IC's package difficult at best.

If a defect that is interior to a packaged IC is not identified until the packaged IC has been assembled onto a circuit board, then the defective part must be removed and replaced through the undesirable rework process (commonly referred to in the electronic industry as the "Known Good Die" problem).

In addition to the repair issue, packaged ICs are problematic from a development perspective. Typically, an engineer will experiment with different circuit layouts while designing an IC, in order to optimize the IC's design. If a design is believed to have merit, a "lot" of ICs is fabricated and packaged for testing. Design flaws and poor performing circuitry are then identified; the remainder of the ICs are scrapped; and the "design and test" cycle is repeated. The permanency of an IC's package therefore turns the development of a functional and robust IC into a serial process.

Although the above problems are only representative of the types of problems that can be encountered during an IC's development (and only some of the above problems may be encountered during the development of any particular IC), encountering any of these problems leads to a long and costly product development cycle.

SUMMARY OF THE INVENTION

In one embodiment of the invention, a circuit feature that is interior to a packaged integrated circuit is modified by first identifying a trimming point on the interior circuit feature using an x-ray inspection system. Coordinates of the trimming point are then related to coordinates of a visible reference marker. The relationship between the visible reference marker and the trimming point is then used to position a cutting tool over the trimming point. Finally, the cutting tool is used to make one or more cuts into the packaged integrated circuit, until the interior circuit feature has been acceptably modified at the trimming point.

BRIEF DESCRIPTION OF THE DRAWINGS

Illustrative and presently preferred embodiments of the invention are illustrated in the drawings, in which:

FIG. 20 illustrates a method for producing batches of packaged integrated circuits with differing characteristics.

DESCRIPTION OF THE PREFERRED EMBODIMENT

Figure 1:
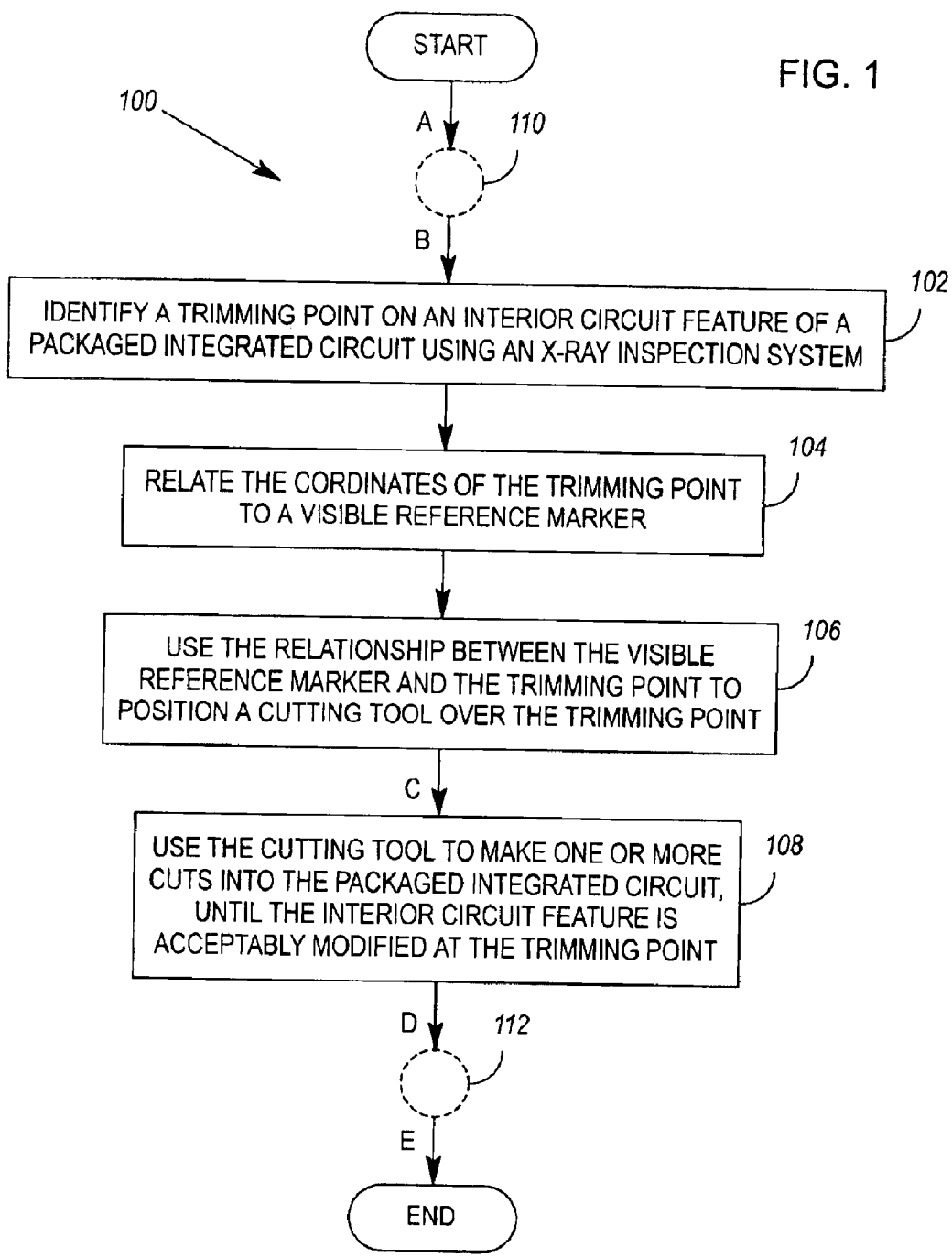
FIG. 1 illustrates a method for modifying a circuit feature that is interior to a packaged integrated circuit.

FIG. 1 illustrates a method 100 for modifying a circuit feature (e.g., a wirebond or trace) that is interior to a packaged integrated circuit. The method 100 commences with the identification 102 of a trimming point on the interior circuit feature using an x-ray inspection system. The coordinates of the trimming point are then related 104 to the coordinates of a visible reference marker. Next, the relationship between the visible reference marker and the trimming point is used to position 106 a cutting tool over the trimming point. Finally, the cutting tool is used 108 to make one or more cuts into the packaged integrated circuit, until the interior circuit feature is acceptably modified at the trimming point.

The phrase "packaged integrated circuit" is defined to include an integrated circuit that has been 1) enclosed within a package, and 2) connected to the external contacts of the package via connections that are interior to the package. By way of example, a "package" may comprise a molded plastic lid 402 that covers and seals a cavity 606 formed in a molded plastic base 404 (see FIGS. 4 & 6); the "external contacts of a package" may comprise pins, pads, solder balls 406, 408 (FIG. 5), or surface contacts; and the connections between an integrated circuit 600 and its package's external contacts 406, 408 may comprise wirebonds 602, 604 (FIG. 6), solder balls, tape/flex/rigid circuits, solder pads, or metallic bumps.

Figure 19:
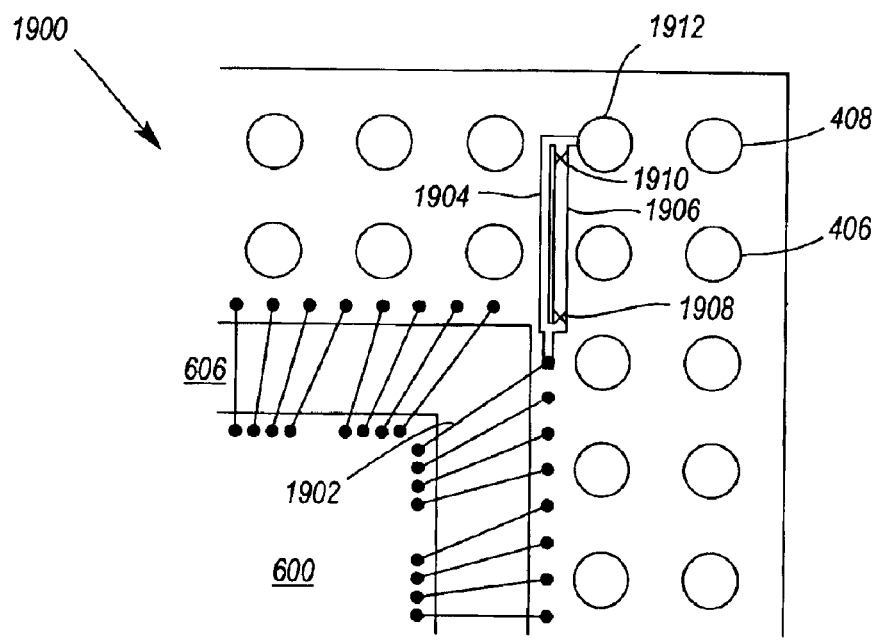
FIG. 19 illustrates an x-ray image of an exemplary packaged integrated circuit that may be subjected to the method shown in FIG. 18.

The phrase "interior circuit feature" is defined to include any circuit feature that is interior to an integrated circuit's package, including wirebonds 602, 604, solder balls, tape/flex/rigid circuits, solder pads, metallic bumps, package traces 1702, 1704 (FIG. 17), tabs, diodes, and resistors 1904, 1906 (FIG. 19).

The method 100 illustrated in FIG. 1 may be modified in a variety of ways, as will be understood by those who are skilled in the art. However, a number of modifications are set forth herein, some of which may be implemented by adding steps to the method 100 at points 110 and/or 112. These modifications are variously illustrated in FIGS. 2, 3, 13 & 14. The modifications 110a, 110b illustrated in FIGS. 2 & 3 will be discussed in the following paragraph, and the modifications 112a, 112b illustrated in FIGS. 13 & 14 will be discussed later in this description.

Figure 2:
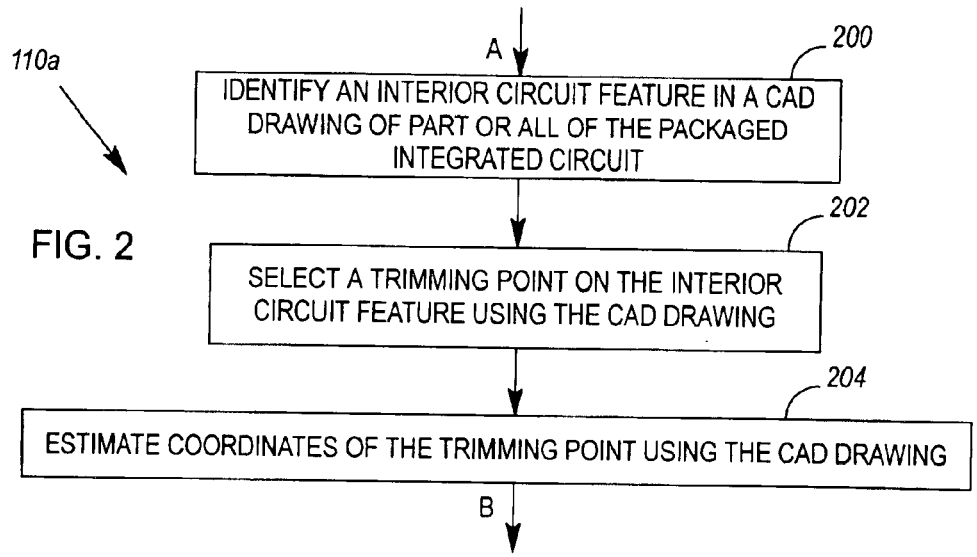
FIGS. 2 & 3 illustrate various modifications to the FIG. 1 method.
Figure 3:
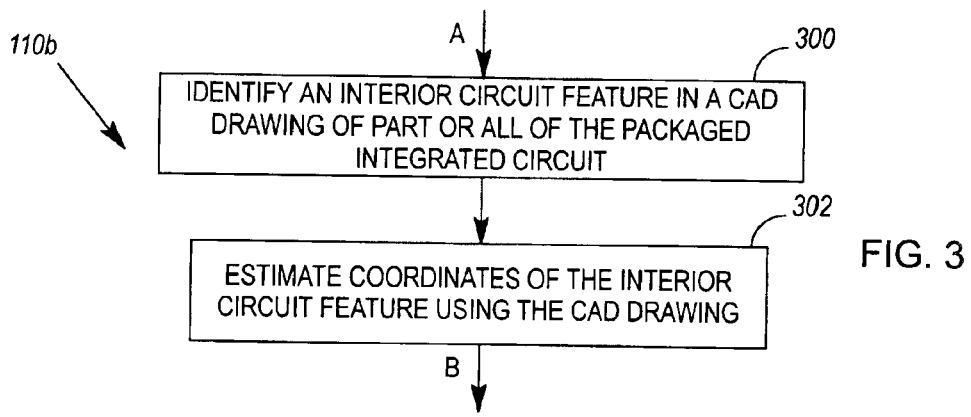

As illustrated in FIG. 2, prior to identifying a trimming point on a circuit feature that is interior to a packaged integrated circuit, the interior circuit feature may be identified 200 in a Computer Aided Design (CAD) drawing of part or all of the packaged integrated circuit. The CAD drawing may also be used to select 202 a trimming point on the interior circuit feature, and to estimate 204 the coordinates of the trimming point. The estimated coordinates of the trimming point may then be used to assist the x-ray inspection system in identifying 102 the trimming point (FIG. 1). Alternately, and as illustrated in FIG. 3, once the interior circuit feature is identified 300 in the CAD drawing, the coordinates of the interior circuit feature may be estimated 302. The coordinates of the interior circuit feature may then be used to assist the x-ray inspection system in identifying the trimming point.

As defined herein, a "CAD drawing" may be a single drawing or a set of drawings.

Regardless of the manner in which the trimming point is first identifed (i.e., whether by visual inspection of the CAD drawing, or by x-ray inspection of the packaged integrated circuit), care should be taken to identify a trimming point that is not buried under other circuit features. Also, preferably, the trimming point should be as distant from neighboring circuit features as possible. If upon x-ray inspection, it is determined that feature misalignment, feature variation, or other manufacturing variation has caused another circuit feature to interfere with an identified trimming point, a new trimming point should be chosen.

Figure 4:
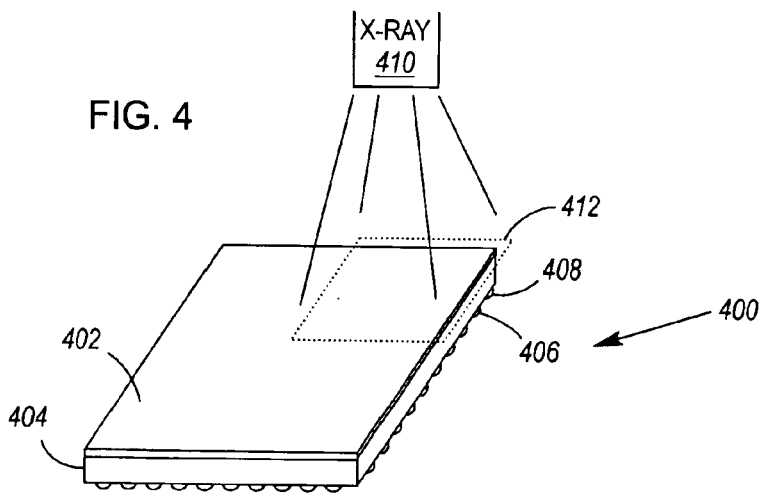
FIG. 4 illustrates x-ray inspection of an exemplary packaged integrated circuit.
Figure 5:
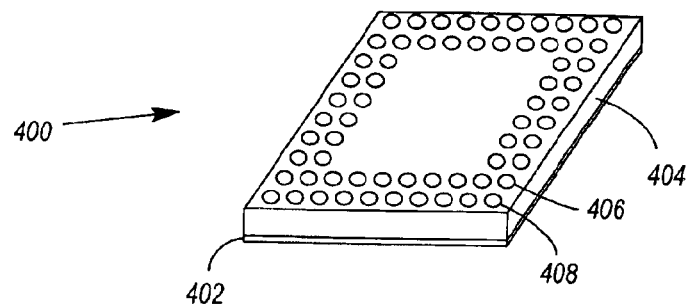
FIG. 5 provides an alternate view of the packaged integrated circuit shown in FIG. 4.
Figure 6:
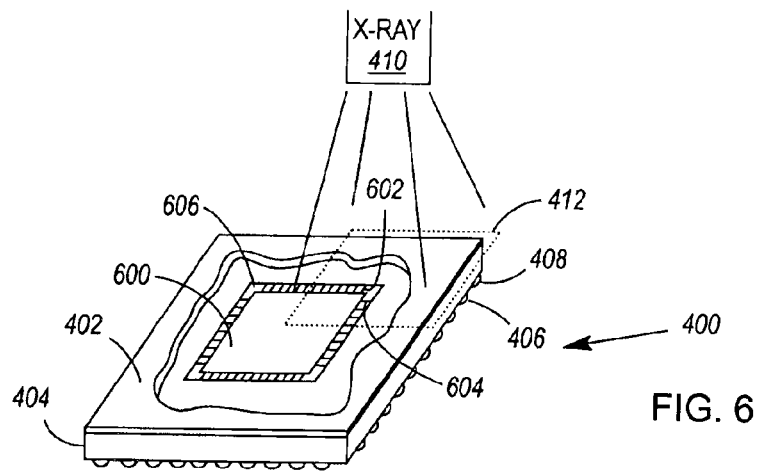
FIG. 6 is similar to FIG. 4, but with a portion of the packaged integrated circuit broken away to reveal the integrated circuit housed therein.

For the purpose of illustrating the FIG. 1 method 100 in practice, FIGS. 4–6 illustrate an exemplary packaged integrated circuit 400. The package of the packaged integrated circuit 400 comprises a molded plastic lid 402 that covers and seals a cavity 606 formed in a molded plastic base 404 (FIG. 6). On the bottom surface of the package base 404 is a ball grid array (BGA) that provides external contacts 406, 408 for an integrated circuit 600 that is mounted within the cavity 606 of the package base 404 (FIG. 5). Vias and/or traces coupled to the balls of the ball grid array pass through the base 404 of the package, and are coupled to the integrated circuit 600 via wirebonds 602, 604.

In accordance with the method disclosed in FIG. 1, an x-ray inspection system 410 is positioned over the packaged integrated circuit 400 so that all or at least some portion 412 of the packaged integrated circuit 400 may be x-rayed (FIG. 4). An image 700 (FIG. 7) is thereby generated from which the precise composition, placement and relations between the various x-rayed parts of the packaged integrated circuit 400 may be derived. Unlike a CAD image, the x-ray image 700 is an image of an actual device. As a result, shifts in positions of the x-rayed parts, as well as other manufacturing variations, are exposed in the x-ray image 700.

Figure 7:
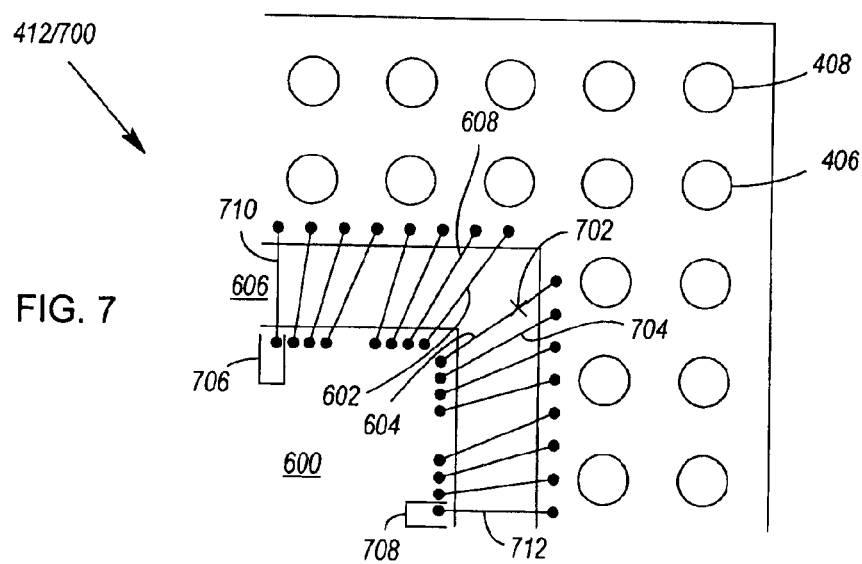
FIG. 7 illustrates an x-ray image of a portion of the packaged integrated circuit shown in FIGS. 4–6.

After acquiring the x-ray image 700, an interior circuit feature, as well as a trimming point thereon, may be identified. In FIG. 7, and by way of example, the identified interior circuit feature is a wirebond 602. If the beam or bit of a cutting tool 800 is very fine, then most interior circuit features will comprise a number of potential trimming points. In FIG. 7, a trimming point 702 is chosen far enough from the integrated circuit 600 to capitalize on the divergence of the identified wirebond 602 from neighboring wirebonds 604, 608.

After identifying a trimming point 702, the coordinates of the trimming point 602 are related to the coordinates of a visible reference marker. In FIG. 7, the visible reference marker is a BGA ball 408. However, the visible reference marker could take a variety of other forms, such as: an edge of a package, an alignment notch of a package, an external contact of another form (i.e., other than a BGA ball). Depending on the granularity of control that is needed to position a cutting tool amongst tightly packed circuit features, as well as the impact of manufacturing variations, the visible reference marker might even comprise a visible reference marker that is "off package", such as: a component or contact on a printed circuit board on which the packaged integrated circuit 400 has been mounted. The visible reference marker could also comprise multiple elements (e.g., two or three BGA balls 406, 408, or a BGA ball and a package alignment notch).

Preferably, the visible reference marker 408 is of such character that it may be easily identified by the x-ray inspection system 410. In this manner, the x-ray inspection system 410 may be used to identify the visible reference marker 408 and relate its coordinates to those of the trimming point 702. Also, preferably, the visible reference marker 408 is initially identified in the same CAD drawing(s) in which the trimming point 702 and/or its interior circuit feature 602 is identified. An estimated relationship between the coordinates of the visible reference marker 408 and the trimming point 702 may therefore be determined prior to x-ray inspection; and a precise relationship between the coordinates may be noted during x-ray inspection.

Figure 8:
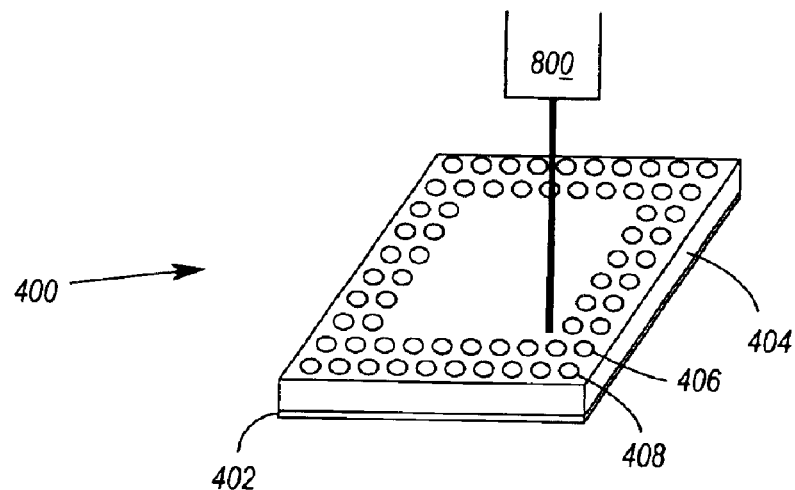
FIG. 8 illustrates a cutting tool positioned over a trimming point on the packaged integrated circuit shown in FIGS. 4–6.

As illustrated in FIG. 8, the relationship between the visible reference marker 408 and the trimming point 702 is used to position a cutting tool 800 over the trimming point 702. Thereafter, the cutting tool 800 is used to make one or more cuts into the packaged integrated circuit 400, until the identified interior circuit feature 602 is acceptably modified at the trimming point 702.

Figure 10:
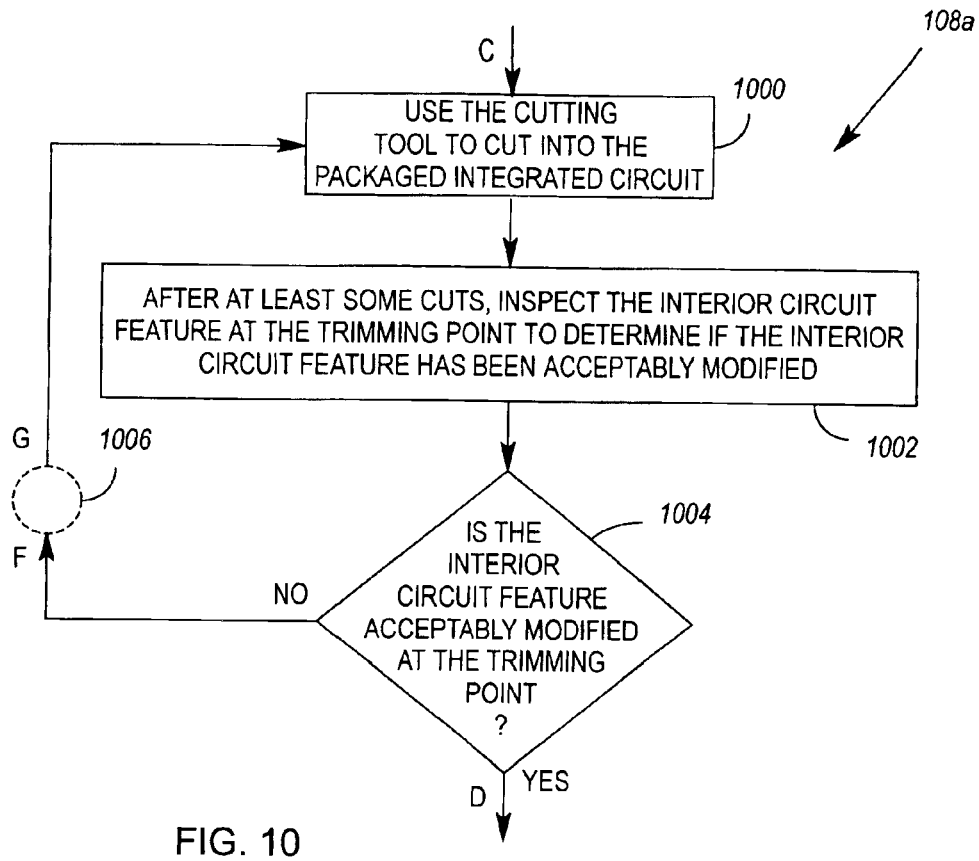
FIGS. 10–14 illustrate additional modifications to the FIG. 1 method.
Figure 11:
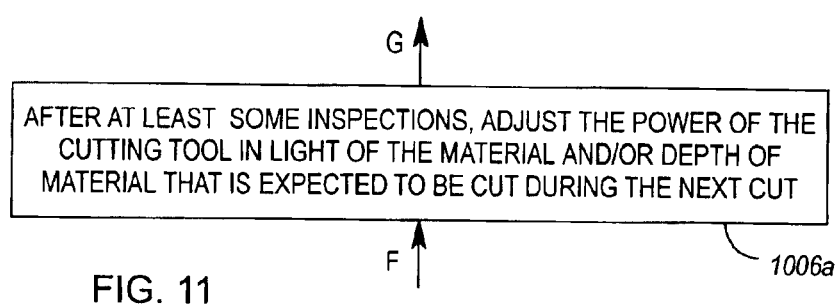
Figure 12:
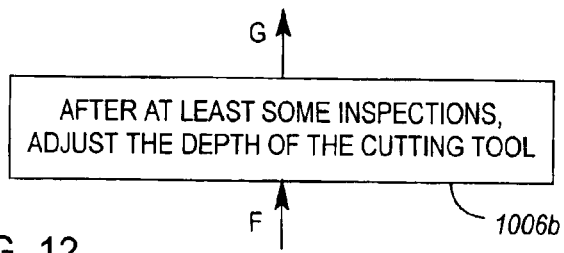

FIG. 10 illustrates a modification 108a of the cutting step illustrated in FIG. 1. In FIG. 10, after at least some of the cuts 1000 into the packaged integrated circuit 400 (and possibly after each cut), the interior circuit feature 602 being modified is inspected 1002 at the trimming point 702 to determine if it has been acceptably modified 1004. Such inspections may be undertaken using the x-ray inspection system 410. In this manner, the position, power, depth and/or other characteristics of the cutting tool 800 may be adjusted as necessary between cuts, and the cutting process may be more carefully controlled. Some of these adjustments 1006a, 1006b are illustrated in FIGS. 11 & 12, and will be discussed later in this description.

Figure 9:
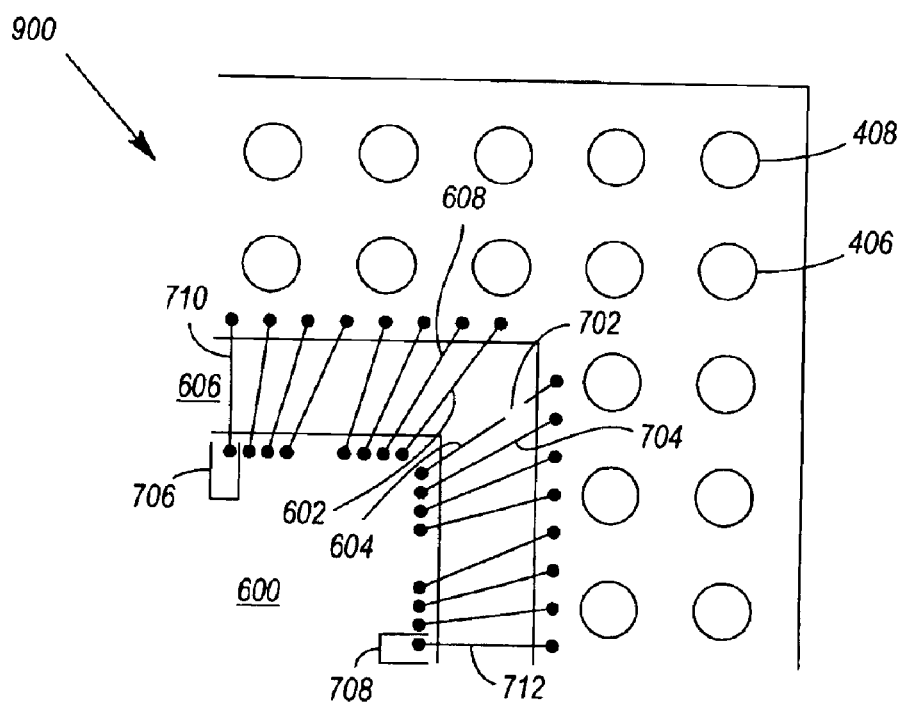
FIG. 9 illustrates an x-ray image of a portion of the packaged integrated circuit shown in FIGS. 4–6, after a wirebond thereof has been cut using the cutting tool shown in FIG. 8.

FIG. 9 illustrates an image 900 generated as a result of x-ray inspection subsequent to cutting. The image 900 shows that the interior circuit feature 602 being modified has been severed at the trimming point 702.

A variety of instruments may be used as the cutting tool 800. For example, the cutting tool may be an Yttrium Aluminum Garnet (YAG) laser, an Excimer laser, or a diamond cutter.

If the cutting tool is a YAG laser, then for each cut made into the packaged integrated circuit 400, the power of the YAG laser's beam can be adjusted in light of the material and/or depth of material that is expected to be cut during the next cut. This is illustrated in the modification 1006a to FIG. 10 illustrated in FIG. 11. The material that is expected to be cut during the next cut may be determined by an estimated guess, or preferably, by x-ray inspection of the trimming point 702. Conductive materials such as copper or gold (e.g., a wirebond) tend to reflect a laser's beam to a greater extent. A laser's beam should therefore be adjusted to a higher power setting for cutting through conductive materials 602, thereby minimizing the number of cuts that need to be made to sever a conductive circuit feature 602. At the same time, the power of a laser's beam should be maintained low enough to avoid cutting too deep into a packaged integrated circuit 400 and risking penetration of circuit features lying below (i.e., deeper than) the trimming point 702. Furthermore, even though lasers may make very precise and narrow cuts, the close spacing of circuit features such as wirebonds 602, 604 may make it difficult to precisely align a cutting tool 800 prior to cutting. In some cases, it is therefore desirable to make an initial cut that does not penetrate deep enough to cut any necessary circuit feature. The alignment of the cut, including the size of the cut and the existence of any debris related to the cut, may then be inspected 1002 (FIG. 10) prior to making additional cuts.

While some cutting tools (e.g., the YAG laser) may require power adjustments during the cutting process, other cutting tools (e.g., the diamond cutter) may require depth adjustments. In the latter case, it may again be desirable in some cases to begin with a shallower than needed cut so that alignment of the cutting tool 800 with respect to the trimming point 702 may be double-checked. Then, after at least some cuts (and possibly after each cut), the interior circuit feature 602 being cut may be inspected 1002 at the trimming point 702 to determine if it has been acceptably modified 1004.

Figure 13:
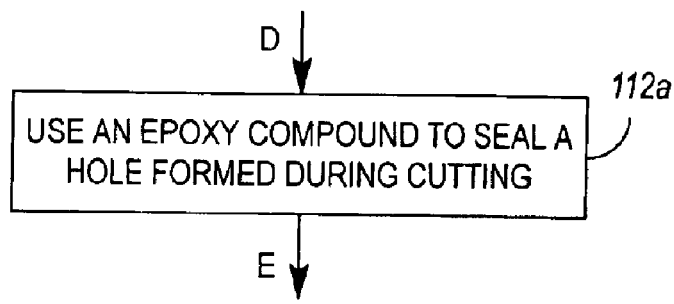
Figure 14:
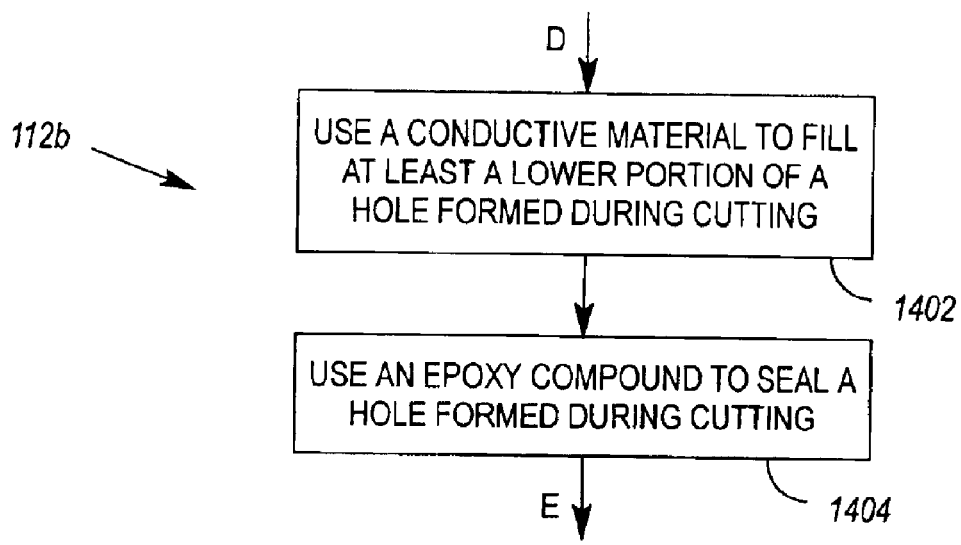

Possible and acceptable modifications of an interior circuit feature 602 include, but are not limited to, severance of the circuit feature 602 (as shown in the "before" and "after" x-ray images 700, 900 depicted in FIGS. 7 & 9) and fusing of the circuit feature. After an acceptable modification has been achieved, an epoxy compound may be used to seal 112a any hole (or holes) that is formed during cutting (FIG. 13). Additionally, and assuming that the inner-layer circuit feature is, for example, an "open" in a circuit feature, some or all of the hole that is formed during cutting may be filled 1402 with a conductive material (FIG. 14). For example, if the hole terminates substantially in between two circuit features that need to be joined (e.g., in between the broken parts of the wirebond 702 depicted in FIG. 9), then the lower portion of the hole may be filled 1402 with a conductive material such as copper. The upper portion of the hole could then be filled 1404 with an epoxy compound. Alternately, if a trimming point is identified on top of a conductor, the entire hole could be filled with conductive material, thereby allowing a device (or ground) that is external to the packaged integrated circuit 400 to make electrical contact with the interior circuit feature.

The above methods have numerous applications. One application is in the repair and recovery of packaged integrated circuits with defective wirebonds or package traces. Wirebonds or package traces that erroneously short two components may be severed, and wirebonds that are broken (or package traces that should be shorted) can be joined by filling all or part of a hole with a conductive material.

Figure 15:
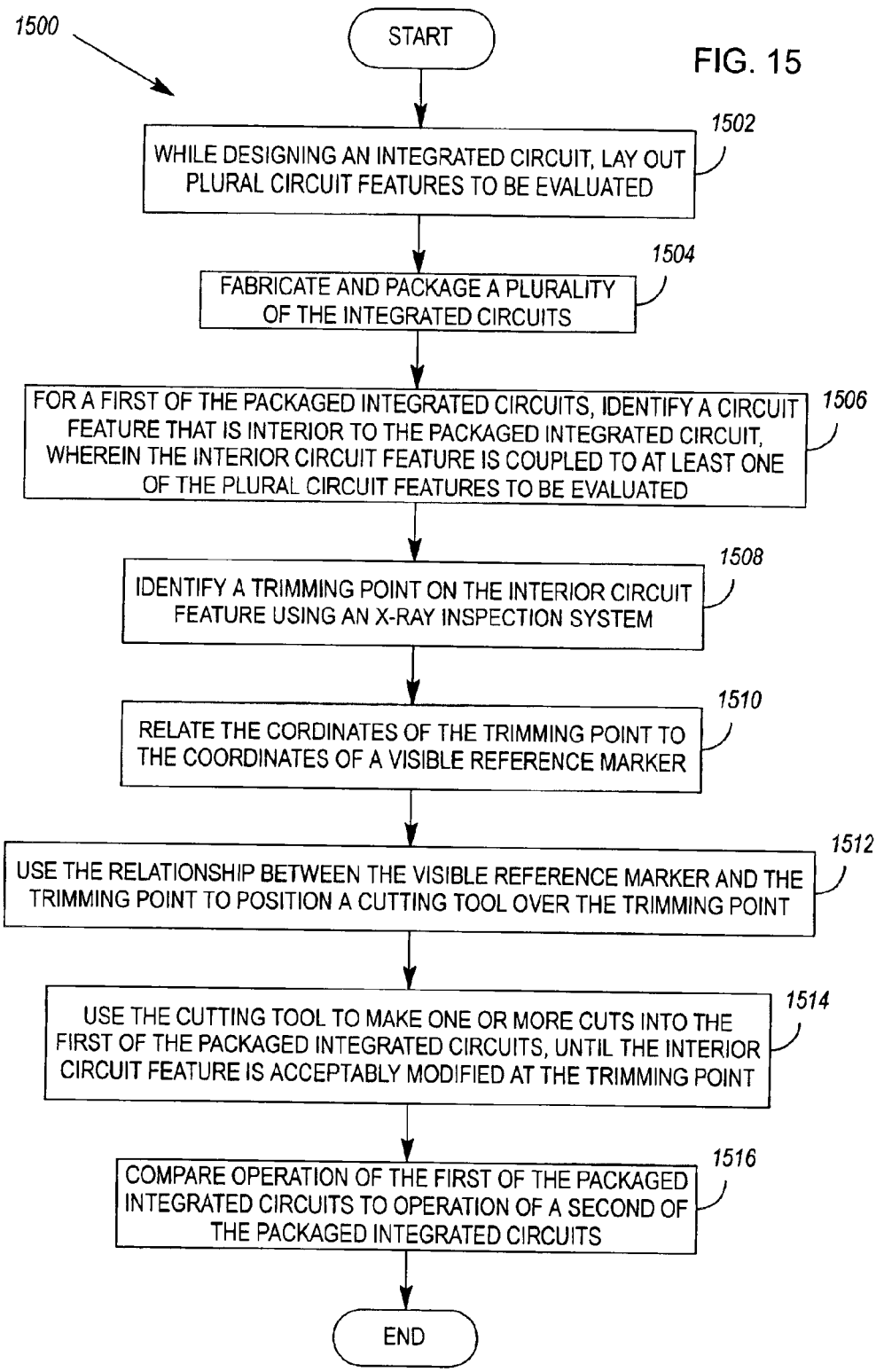
FIG. 15 illustrates a first parallel design process for integrated circuits.

Another application for the above methods is in research and development. For example, FIG. 15 illustrates a parallel design process 1500 for integrated circuits, wherein plural circuit features to be evaluated are laid out 1502 during the design process. The plural features might take the form of alternate driver configurations, alternate receivers, alternate clock distribution circuits, or even alternate mission circuitry configurations. After laying out the plural circuit features to be evaluated, a plurality of integrated circuits are fabricated and packaged 1504 as designed. For a first of the packaged integrated circuits, a circuit feature is identified 1506 that is 1) interior to the packaged integrated circuit, and 2) coupled to at least one of the plural circuit features to be evaluated. A trimming point is then identified 1508 on the interior circuit feature using an x-ray inspection system. Thereafter, the coordinates of the trimming point are related 1510 to the coordinates of a visible reference marker; and this relationship is used 1512 to position a cutting tool over the trimming point. Next, the cutting tool is used 1514 to make one or more cuts into the first of the packaged integrated circuits, until the interior circuit feature has been acceptably modified at the trimming point. Operation of the first of the packaged integrated circuits may then be compared 1516 to the operation of a second of the packaged integrated circuits, wherein the second of the packaged integrated circuits has been modified differently than the first, or not modified at all. In this manner, a designer can determine whether the enablement, disablement, or other modification of a proposed circuit feature is beneficial to a design. Furthermore, the designer can experiment with various design modifications in parallel, thus streamlining what is typically a very long, serial, development process.

FIG. 7 illustrates an x-ray image 700 of an integrated circuit 600 that has been designed in accordance with the parallel design process 1500 illustrated in FIG. 15. By way of example, the integrated circuit 600 comprises two circuit features 706, 708 to be evaluated, and each of the circuit features 706, 708 is coupled to the external contacts of a package via a wirebond 710, 712. If two or more integrated circuits are fabricated and packaged as illustrated in FIG. 7, one or more of the packaged integrated circuits may be modified by severing wirebond 710, and one or more additional packaged integrated circuits may be modified by severing wirebond 712. Depending on the nature of the circuit features 706, 708 being evaluated, one or more of the packaged integrated circuits may also be left "as is". Operation of the variously modified packaged integrated circuits may then be compared to determine the best design. After choosing a "production design", discarded design features may be eliminated from the design before additional packaged integrated circuits are fabricated. Alternatively, usable, packaged integrated circuits may be produced without a redesign by simply applying the useful modifications to additional ones of the initial batch of packaged integrated circuits.

Figure 16:
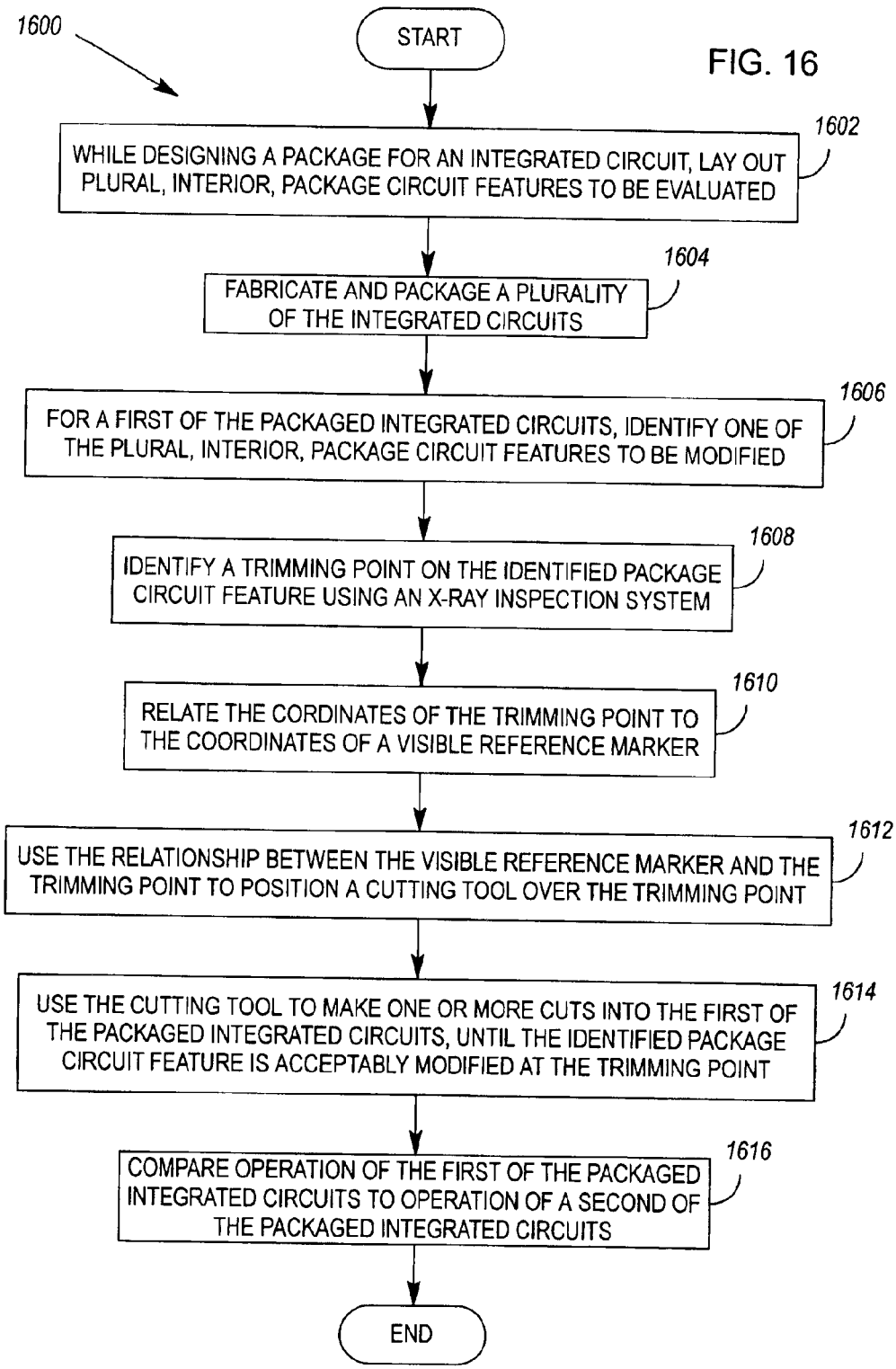
FIG. 16 illustrates a second parallel design process for integrated circuits.

FIG. 16 illustrates a second parallel design process 1600 for integrated circuits. In this process, plural, interior, package circuit features to be evaluated are laid out 1602 while designing an integrated circuit's package. The plural features might take the form of alternate package signal routes, alternate package traces, alternate tabs, alternate wirebonds, and/or other package circuit features. After laying out the plural features to be evaluated, a plurality of integrated circuits are fabricated and packaged 1604 as designed. For a first of the packaged integrated circuits, one of the plural package circuit features is identified 1606 for modification. A trimming point is then identified 1608 on the circuit feature using an x-ray inspection system. Thereafter, the coordinates of the trimming point are related 1610 to the coordinates of a visible reference marker; and this relationship is used 1612 to position a cutting tool over the trimming point. Next, the cutting tool is used 1614 to make one or more cuts into the first of the packaged integrated circuits, until the identified package circuit feature has been acceptably modified at the trimming point. Operation of the first of the packaged integrated circuits may then be compared 1616 to the operation of a second of the packaged integrated circuits, wherein the second of the packaged integrated circuits has been modified differently than the first, or not modified at all. In this manner, a designer can determine whether the enablement, disablement, or other modification of an interior package circuit feature is beneficial to a design. Furthermore, the designer can experiment with various design modifications in parallel, thus streamlining what is typically a very long, serial, development process.

Figure 17:
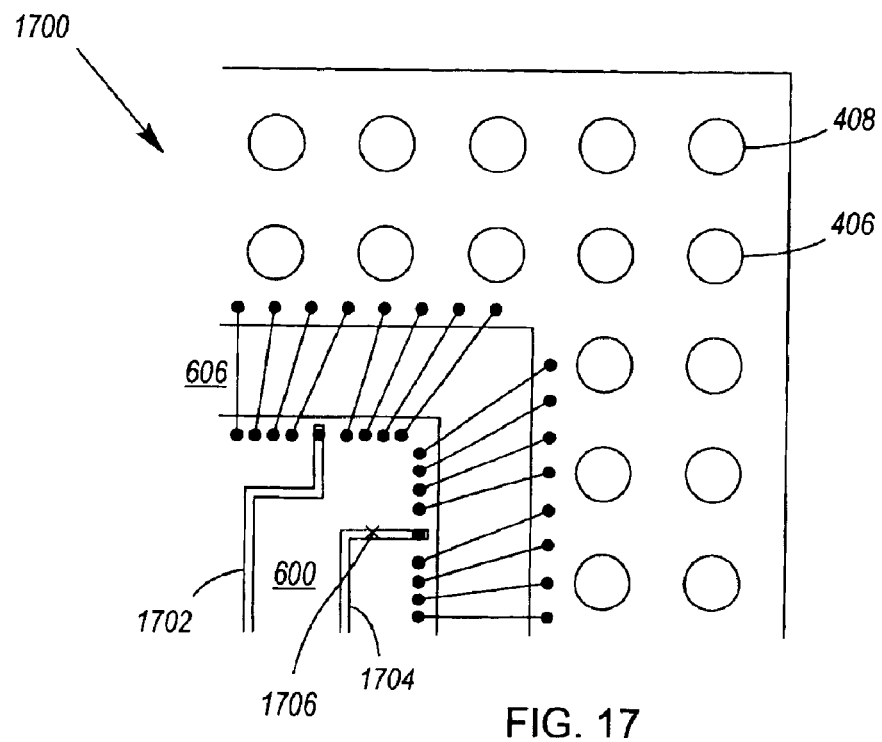
FIG. 17 illustrates an x-ray image of an exemplary packaged integrated circuit that may be subjected to the method shown in FIG. 16.

FIG. 17 illustrates an x-ray image 1700 of a packaged integrated circuit that has been designed in accordance with the parallel design process 1600 illustrated in FIG. 16. By way of example, the packaged integrated circuit comprises two package traces 1702, 1704 that are to be evaluated. Although the function of the package traces 1702, 1704 is largely irrelevant to the operation of the FIG. 16 design process, the package traces 1702,1704 might exist for the purpose of distributing an integrated circuit's global clocks "on-package". If two or more integrated circuits are fabricated and packaged as illustrated in FIG. 17, one or more of the packaged integrated circuits may be modified by severing a first of the package traces 1704 at trimming point 1706. The operation of this packaged integrated circuit may then be compared to the operation of differently modified and/or non-modified ones of the packaged integrated circuits, for the purpose of determining which of the packaged integrated circuits works best. After choosing a "production design", discarded design features may be eliminated from the design before additional packaged integrated circuits are fabricated. Alternatively, usable, packaged integrated circuits may be produced without a redesign by simply applying the useful modifications to additional ones of the initial batch of packaged integrated circuits.

Figure 18:
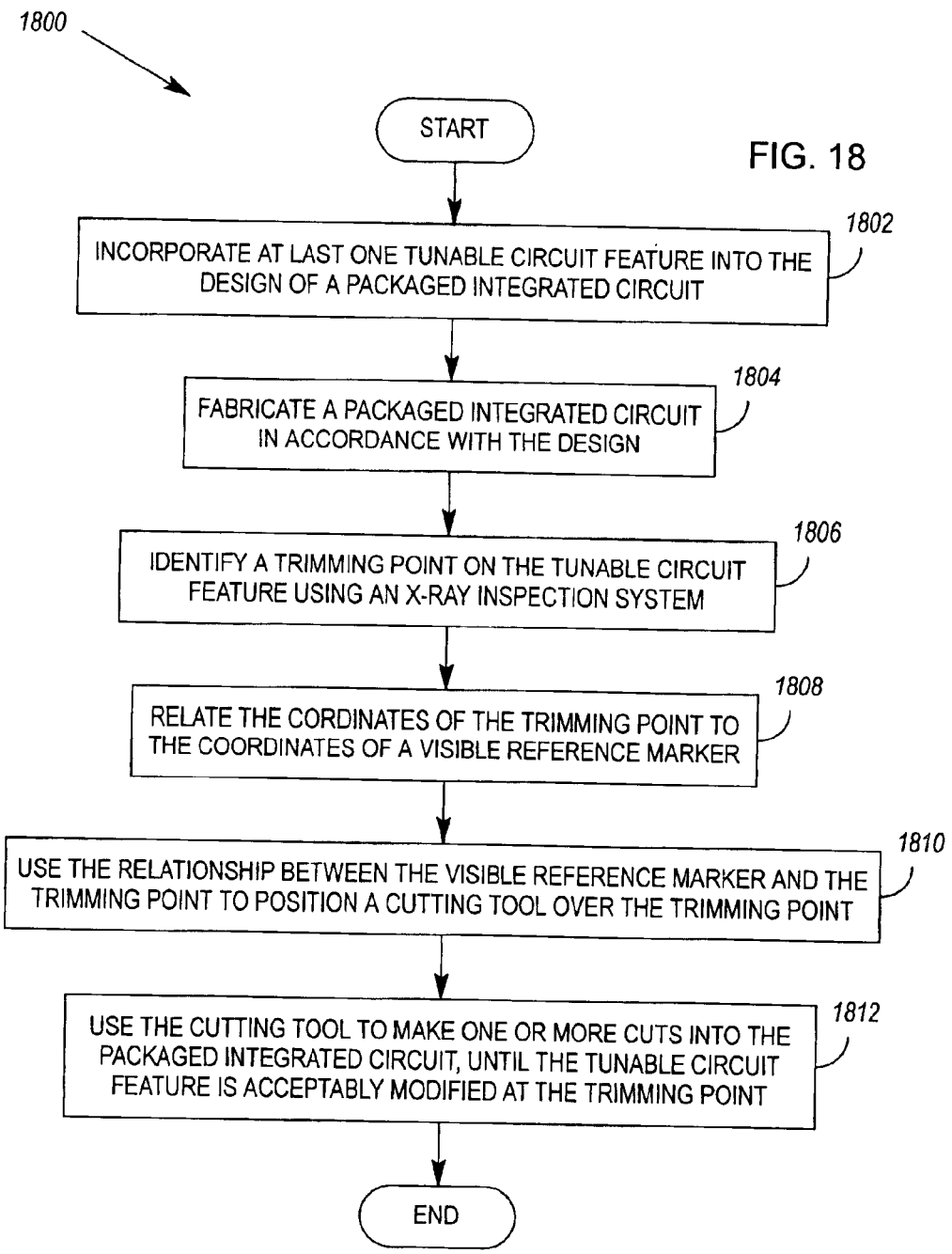
FIG. 18 illustrates a method for tuning a packaged integrated circuit.

Yet another application for the FIG. 1 method is illustrated in FIG. 18. FIG. 18 illustrates a method 1800 for tuning a packaged integrated circuit. In accordance with the method, at least one tunable circuit feature is incorporated 1802 into a packaged integrated circuit design. By way of example, the tunable circuit feature could be: a package trace that is coupled to an optional circuit feature; a resistor network; or a wirebond that is coupled to an optional circuit feature. After completing the design of the packaged integrated circuit, one or more packaged integrated circuits are fabricated 1804 in accordance with the design. A trimming point on the tunable circuit feature is then identified 1806 using an x-ray inspection system. Thereafter, the coordinates of the trimming point are related 1808 to the coordinates of a visible reference marker; and this relationship is used 1810 to position a cutting tool over the trimming point. Next, the cutting tool is used 1812 to make one or more cuts into the packaged integrated circuit, until the tunable circuit feature has been acceptably modified at the trimming point. Acceptable modification of the tunable circuit feature may, in some cases, comprise removal of the tunable circuit feature.

FIG. 19 illustrates an x-ray image 1900 of a packaged integrated circuit that has been designed in accordance with the parallel design process 1800 illustrated in FIG. 18. By way of example, the packaged integrated circuit comprises a resistor network 1904, 1906 that couples a wirebond 1902 to an external package contact 1912. The resistor network comprises two resistive traces 1904, 1906. By means of the method illustrated in FIG. 18, the resistor network may be tuned by severing the network at one or both of the trimming points 1908, 1910 that are illustrated in FIG. 19. Such a modification might be made, for example, to change the termination resistance of the external contact 1912.

It should be noted that for each of the parallel design processes 1500, 1600 illustrated in FIGS. 15 & 16, as well as the method 1800 for tuning an integrated circuit illustrated in FIG. 18, the visible reference marker could be identified using the same x-ray inspection system that is used to identify the trimming point.

It should also be noted that the parallel design processes 1500, 1600 illustrated in FIGS. 15 & 16, as well as the method 1800 for tuning an integrated circuit illustrated in FIG. 18, may be practiced individually, or in various combinations, depending on 1) the type and number of design choices that a designer would like to evaluate, and/or 2) the degree of tunability that a designer would like to incorporate into his or her design.

FIG. 20 illustrates a method 2000 that applies some or all of the above methods 100, 1500, 1600, 1800 for the purpose of producing batches of packaged integrated circuits with differing characteristics. In accordance with the method, an integrated circuit and package therefor are designed 2002 to incorporate at least one optional circuit feature. A plurality of packaged integrated circuits is then fabricated 2004 as designed. The plurality of packaged integrated circuits is then divided 2006 into at least two batches, and for the packaged integrated circuits of a first batch, a circuit feature that enables one of the optional circuit features is identified 2008 (with the identified circuit feature being interior to the packaged integrated circuits of the first batch). Next, a trimming point is identified 2010 on the interior circuit feature using an x-ray inspection system. Thereafter, the coordinates of the trimming point are related 2012 to the coordinates of a visible reference marker; and this relationship is used 2014 to position a cutting tool over the trimming point. Finally, the cutting tool is used 2016 to make one or more cuts into the packaged integrated circuits of the first batch, until the interior circuit feature has been acceptably modified in at least some of the packaged integrated circuits of the first batch. In this manner, a batch of packaged integrated circuits that differs from other batches of packaged integrated circuits is created.

If all of the packaged integrated circuits of a batch are held to within small manufacturing tolerances, then the steps of 1) identifying 2008 an interior circuit feature, 2) identifying 2010 a trimming point, and 3) relating 2012 the coordinates of the trimming point to a visible reference marker, need only be performed for some (and possibly only one) of the packaged integrated circuits in the batch. This assumes that similar devices in a "lot" of packaged integrated circuits will be able to be similarly modified.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for modifying a circuit feature that is interior to a packaged integrated circuit, comprising:
   a) identifying a trimming point on the interior circuit feature using an x-ray inspection system;
   b) relating coordinates of the trimming point to coordinates of a visible reference marker;

c) utilizing the relationship between the visible reference marker and the trimming point to position a cutting tool over the trimming point; and d) utilizing the cutting tool to make one or more cuts into the packaged integrated circuit, until the interior circuit feature has been acceptably modified at the trimming point.

2. The method of claim 1, wherein the interior circuit feature is a wirebond.

3. The method of claim 1, wherein the interior circuit feature is a package trace.

4. The method of claim 1, wherein the interior circuit feature is a tab.

5. The method of claim 1, further comprising identifying the visible reference marker using the x-ray inspection system.

6. The method of claim 1, wherein:

a) the package of the packaged integrated circuit comprises a ball grid array; and b) the visible reference marker comprises a ball of the ball grid array.

7. The method of claim 1, wherein the cutting tool is a YAG laser.

8. The method of claim 1, further comprising, after at least some of the one or more cuts into the packaged integrated circuit, inspecting the interior circuit feature at the trimming point to determine if the interior circuit feature has been acceptably modified.

9. The method of claim 8, wherein the inspections of the interior circuit feature are performed using the x-ray inspection system.

10. The method of claim 8, wherein, after at least some inspections of the interior circuit feature at the trimming point, one or more characteristics of the cutting tool are adjusted.

11. The method of claim 1, further comprising, after the interior circuit feature is acceptably modified at the trimming point, utilizing epoxy compound to seal a hole formed during cutting.

12. The method of claim 1, further comprising, after the interior circuit feature is acceptably modified at the trimming point, filling with a conductive material, at least a lower portion of a hole formed during cutting.

13. The method of claim 1, wherein acceptably modifying the interior circuit feature comprises severing the interior circuit feature.

14. The method of claim 1, wherein the visible reference marker is located on the package of the packaged integrated circuit.

15. The method of claim 1, wherein the visible reference marker is located on a printed circuit board on which the packaged integrated circuit is mounted.

* * * * *